United States Patent
Ramaraju et al.

(10) Patent No.: US 7,825,720 B2
(45) Date of Patent: Nov. 2, 2010

(54) CIRCUIT FOR A LOW POWER MODE

(75) Inventors: Ravindraraj Ramaraju, Round Rock, TX (US); David R. Bearden, Austin, TX (US); Kenneth R. Burch, Austin, TX (US); Charles E. Seaberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 12/372,997

(22) Filed: Feb. 18, 2009

(65) Prior Publication Data

US 2010/0207687 A1 Aug. 19, 2010

(51) Int. Cl.
*G05F 1/10* (2006.01)

(52) U.S. Cl. .................... 327/543; 327/544

(58) Field of Classification Search .............. 327/544
See application file for complete search history.

(56) References Cited

U.S. PATENT DOCUMENTS

| | | | | |
|---|---|---|---|---|
| 5,552,740 A * | 9/1996 | Casper | | 327/541 |
| 6,111,394 A * | 8/2000 | Casper | | 323/273 |
| 6,281,744 B1 * | 8/2001 | Kang | | 327/541 |
| 6,380,799 B1 * | 4/2002 | Chung et al. | | 327/543 |
| 6,509,786 B2 * | 1/2003 | Uekubo | | 327/538 |
| 6,560,139 B2 | 5/2003 | Ma et al. | | |
| 6,836,179 B2 * | 12/2004 | Mizuno et al. | | 327/544 |
| 6,906,582 B2 | 6/2005 | Kase et al. | | |
| 6,909,320 B2 | 6/2005 | Chan et al. | | |
| 6,933,772 B1 * | 8/2005 | Banerjee et al. | | 327/541 |
| 7,064,601 B2 * | 6/2006 | Kwak et al. | | 327/541 |
| 7,091,712 B2 | 8/2006 | Miller et al. | | |
| 7,099,230 B1 | 8/2006 | Tran | | |
| 7,110,317 B2 | 9/2006 | Song et al. | | |
| 7,126,861 B2 | 10/2006 | Hose, Jr. et al. | | |
| 7,135,842 B2 | 11/2006 | Banerjee et al. | | |

(Continued)

OTHER PUBLICATIONS

Nii et al.: "A 90 nm Low Power 32K-Byte Embedded SRAM with Gate Leakage Suppression Circuit for Mobile Applications"; 2003 Symposium on VLSI Circuits Digest of Technical Papers; 2003; pp. 247-250; IEEE.

(Continued)

*Primary Examiner*—Lincoln Donovan
*Assistant Examiner*—Thomas J Hiltunen
(74) *Attorney, Agent, or Firm*—Kim Marie Vo; Joanna G. Chiu (57) ABSTRACT

A circuit has a first transistor having a first current electrode coupled to a first supply voltage terminal and a second current electrode coupled to a virtual supply voltage node. A second transistor has a first current electrode coupled to the first supply voltage terminal and a control electrode coupled to the virtual supply voltage node. A first load has an input and has an output coupled to a second current electrode of the second transistor. A third transistor has a control electrode coupled to the output of the first load. A second load has an input coupled to the first supply voltage terminal, and has an output that is coupled to both a control electrode of the first transistor and a first current electrode of the third transistor. The virtual supply voltage node provides an operating voltage to a circuit module that alternates between normal and drowsy operating modes.

19 Claims, 3 Drawing Sheets

U.S. PATENT DOCUMENTS

| | | | |
|---|---|---|---|
| 7,235,959 | B2 | 6/2007 | Sicard |
| 7,253,595 | B2 | 8/2007 | Oddoart et al. |
| 7,268,524 | B2 | 9/2007 | Kase et al. |
| 7,414,457 | B2 * | 8/2008 | Ogawa et al. ............... 327/538 |
| 7,423,416 | B1 | 9/2008 | Quinones et al. |
| 7,432,693 | B2 | 10/2008 | Enjalbert |
| 7,439,718 | B2 | 10/2008 | Rozen et al. |
| 7,441,137 | B1 | 10/2008 | Mimberg |
| 7,463,013 | B2 | 12/2008 | Plojhar |
| 7,479,824 | B2 | 1/2009 | Bushman et al. |
| 7,554,312 | B2 * | 6/2009 | Fulton et al. ............... 323/315 |
| 7,619,440 | B2 | 11/2009 | Amedeo et al. |
| 2009/0096433 | A1 * | 4/2009 | Gerber et al. ............... 323/270 |

OTHER PUBLICATIONS

Tschanz et al.; "Dynamic Sleep Transistor and Body Bias for Active Leakage Power Control of Microprocessors"; IEEE Journal of Solid State Circuits; Nov. 2003; pp. 1838-1845; vol. 38, No. 11. IEEE.

Bhavnagarwala et al.; "A Pico-Joule Class, 1 GHz, 32 KByte×64b DSP SRAM with Self Reverse Bias"; 2003 Symposium of VLSI Circuits Digest of Technical Papers; 2003; pp. 251-252; IEEE.

Chang et al.; "The 65-nm 16-MB Shared On-Die L3 Cache for the Dual-Core Intel Xeon Processor 7100 Series"; IEEE Journal of Solid-State Circuits; Apr. 2007; pp. 846-852; vol. 42, No. 4; IEEE.

Vangal et al.;"An 80-Tile Sub-100-W TeraFLOPS Processor in 65-nm CMOS"; IEEE Journal of Solid-State Circuits; Jan. 2008; pp. 29-41; vol. 43, No. 1; IEEE.

* cited by examiner

CIRCUIT FOR A LOW POWER MODE

BACKGROUND

1. Field

This disclosure relates generally to semiconductors, and more specifically, to the control of a supply voltage used by semiconductors.

2. Related Art

Integrated circuits are required to efficiently use power. To reduce power consumption, some integrated circuits function in two differing power modes such as a normal power mode and a reduced power mode for idle states of operation. For example, the reduced power mode may be entered during time periods of inactivity in an effort to reduce static current leakage in digital logic circuitry.

When electronic circuits first transition from the reduced power mode to the normal power mode a certain amount of time delay exists in order to re-establish a higher operating voltage in the circuitry. In some applications state information must be restored prior to beginning normal operation. The time delay associated with leaving a reduced power mode of operation is undesirable to the user of the integrated circuit. Also, when supply voltages transition from a ground value (i.e. a first rail value) to a full value, the transition can generate current spiking in some circuitry. Some circuits reduce the supply voltage by a diode drop, which is equivalent to a transistor threshold, as opposed to removing the supply voltage during the reduced power mode of operation. However, such circuits experience variation in the voltage that is reduced as a result of variation in circuit parameters over process and temperature. As a result, the amount of power being conserved during the reduced power mode of operation significantly varies and is difficult to quantize.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
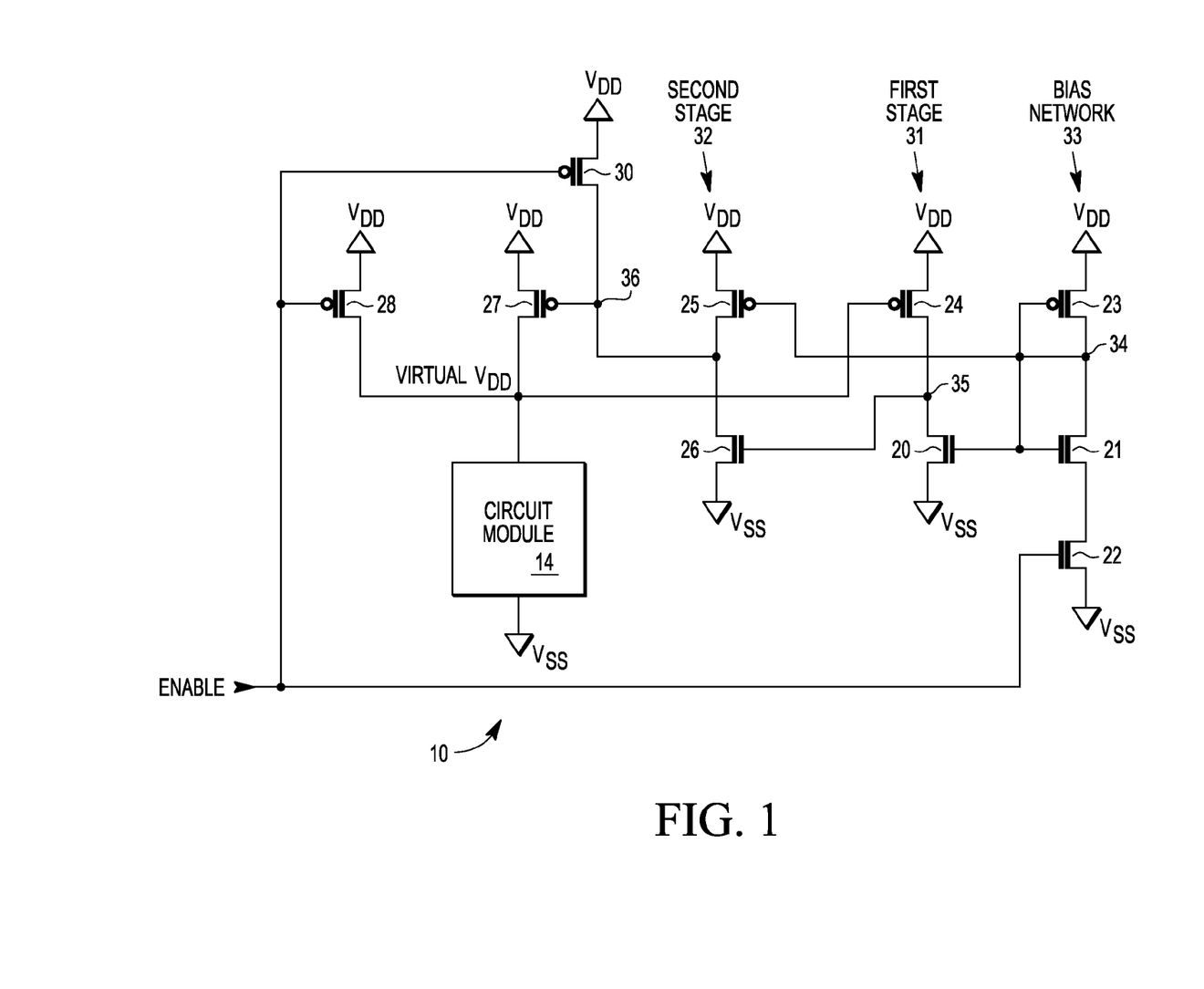
FIG. 1 illustrates in schematic form a circuit for voltage control in a semiconductor having a low power mode in accordance with one form of the present invention.

Illustrated in FIG. 1 is circuitry for providing an operating voltage when having a low power or idle mode of operation. Circuit 10 implements a voltage regulating function to accurately maintain a reduced operating voltage without requiring circuitry that itself uses a significant amount of power or requires a significant amount of area. In the illustrated form the circuit 10 has a first stage 31 and a second stage 32 that are biased by a bias network 33. Bias network 33 has a P-channel transistor 23 having a first current electrode or source connected to a power terminal for receiving a $V_{DD}$ power supply voltage. A control electrode or gate and a second current electrode or drain of transistor 23 are connected together at a node 34 to form a diode-connected transistor 23. The drain of transistor 23 is connected to a drain of an N-channel transistor 21. A gate of transistor 21 is connected to the gate of transistor 23 at node 34. A source of transistor 21 is connected to a drain of an N-channel transistor 22. A source of transistor 22 is connected to a power supply terminal for receiving a voltage $V_{SS}$. In one form the $V_{SS}$ is an earth ground potential, but in other forms the $V_{SS}$ voltage may be other voltage values including negative voltages. Regardless of the value of $V_{SS}$, the power supply voltage $V_{DD}$ is a more positive voltage than $V_{SS}$. The first stage 31 has a P-channel transistor 24 having a source connected to a power supply voltage terminal for receiving the $V_{DD}$ supply voltage. A gate of transistor 24 is connected to a Virtual $V_{DD}$ node, and a drain of transistor 24 is connected to a drain of an N-channel transistor 20 at a node 35. A gate of transistor 20 is connected to the gates of transistors 21 and 23 at node 34. A source of transistor 20 is connected to a voltage terminal for receiving the $V_{SS}$ voltage. The second stage 32 has a P-channel transistor 25 having a source connected to a terminal for receiving the $V_{DD}$ supply voltage. A gate of transistor 25 is connected to the gates of transistors 21 and 23 and the drain of transistor 23 at the node 34. A drain of transistor 25 is connected to a drain of an N-channel transistor 26 at a node 36. A gate of transistor 26 is connected to the drain of transistor 20 at a node 35, and a source of transistor 26 is connected to a voltage terminal for receiving the $V_{SS}$ voltage. A P-channel transistor 27 has a source connected to a terminal for receiving the $V_{DD}$ supply voltage, a gate connected to the node 36 and a drain connected to the virtual $V_{DD}$ node. A circuit module 14 has a first power supply terminal connected to the virtual $V_{DD}$ node. A second power supply terminal of the circuit module 14 is connected to a voltage terminal for receiving the $V_{SS}$ voltage. The circuit module 14 may be any of a wide variety of types of electronic circuits. For example, circuit module 14 may be digital logic circuitry, a state element such as one or more flip-flops, a memory element such as a cache, a processing unit or a core in a system-on-chip (SOC) or a sea of gates for implementing a logic function. A P-channel transistor 28 has a source connected to a terminal for receiving the $V_{DD}$ supply voltage. A gate of transistor 28 is connected to the gate of a P-channel transistor 30 for receiving an Enable signal. The gate of transistor 22 also receives the Enable signal. In one form the gate of transistor 22 is connected to the gate of transistor 28 and the gate of transistor 30. A drain of transistor 28 is connected to the Virtual ground node. A source of transistor 30 is connected to a terminal for receiving the $V_{DD}$ supply voltage.

In operation, circuit 10 functions to provide either a full supply voltage $V_{DD}$ or a reduced supply voltage to power the circuit module 14. The Enable signal directly determines which voltage, $V_{DD}$ or reduced $V_{DD}$, is coupled to the circuit module 14. When the enable signal is a high logic value to place circuit module 14 of circuit 10 in an idle state of operation, transistors 28 and 30 are nonconductive and transistor 22 is conductive. The idle state of operation is a "drowsy" mode or an "Idle" mode of operation in which circuit module 14 is sufficiently powered to maintain state information at a reduced $V_{DD}$ supply voltage. In this mode of operation, there is typically no normal circuit activity within circuit module 14. Thus the term "Idle mode" is herein used. Any functional activity which might occur during the Idle mode occurs at a reduced frequency. The bias network 33 is enabled and node 34 is set at a bias voltage. Transistors 21, 23 and 25 form a current mirror circuit. The current that is flowing through transistors 21 and 23 is mirrored into transistors 20 and 25. The bias voltage of bias network 33 may assume various values and is determined by the physical and electrical characteristics of transistors 21 and 23. The first stage 31 has a gain element established by transistor 24. A gate-to-source voltage, $V_{GS}$, is established across transistor 24 on the Virtual $V_{DD}$ node. Transistor 20 functions as a load (i.e. also a current source) for transistor 24. The second stage 32 has a gain element that is established by transistor 26. Transistor 25 functions as a load for transistor 26. Transistor 27 provides a control gate for the first stage 31 and second stage 32 for providing a reduced $V_{DD}$ to the Virtual $V_{DD}$ node. In this way, transistor 27 may be considered a third stage to the first stage 31 and second stage 32 with the circuit module 14 functioning as a load.

The voltage at the virtual $V_{DD}$ node is determined by the $V_{GS}$ of transistor 24. The desired voltage at the virtual $V_{DD}$ node is accomplished by the design of the physical and electrical characteristics of transistors 24 and 20. These characteristics primarily include the transistor channel dimensions and the transistor threshold voltage characteristic. During operation, if the Virtual $V_{DD}$ node drifts downward from the design's operating value, transistor 24 becomes biased stronger and the voltage at node 35 increases. This increase of voltage at node 35 biases transistor 26 stronger which in turn reduces the voltage bias applied to the gate of transistor 27 at node 36. Transistor 27 therefore is biased stronger which has the effect of increasing the voltage at the Virtual $V_{DD}$ node to counter the downward drift of voltage. If the Virtual $V_{DD}$ node drifts upward from the design's operating value, transistor 24 becomes biased weaker and the voltage at node 35 decreases. This decrease of voltage at node 35 biases transistor 26 weaker which in turn increases the voltage bias applied to the gate of transistor 27 at node 36. Transistor 27 therefore is biased less which has the effect of decreasing the voltage at the Virtual $V_{DD}$ node to counter the upward drift of voltage. These voltage relationships function as negative feedback to counter voltage changes (either up or down) at the Virtual $V_{DD}$ node. The negative feedback results from an odd number of stages wherein each stage implements a signal inversion between its input and output. The negative feedback response is determined by the loop gain of the product of the gains of the first stage 31, the second stage 32 and the transistor 27.

When the Enable signal has a low logic value, transistors 28 and 30 are conductive and transistor 22 is nonconductive. The Enable signal places the circuit module 14 in a normal mode of operation. In the normal mode of operation the full supply voltage value, $V_{DD}$, is connected to the Virtual $V_{DD}$ node by transistor 28. In this mode, the conduction of transistor 30 places the gate of transistor 27 at $V_{DD}$ to make transistor 27 nonconductive. Therefore, transistor 28 is the only transistor device connecting a voltage to the virtual $V_{DD}$ node. When transistor 22 is nonconductive, the bias voltage at node 34 is established at $V_{DD}$. The transistors 24 and 25 are nonconductive. Transistor 20 is made conductive under these operating conditions. As a result, node 35 is placed at the $V_{SS}$ potential and transistor 26 is therefore nonconductive. Since transistor 30 is conductive, the node 36 is placed at $V_{DD}$ which makes transistor 27 nonconductive. A portion of the circuit 10 remains inoperative until the Enable control signal transitions back to a logic high which indicates entrance into the Idle mode.

Figure 2:
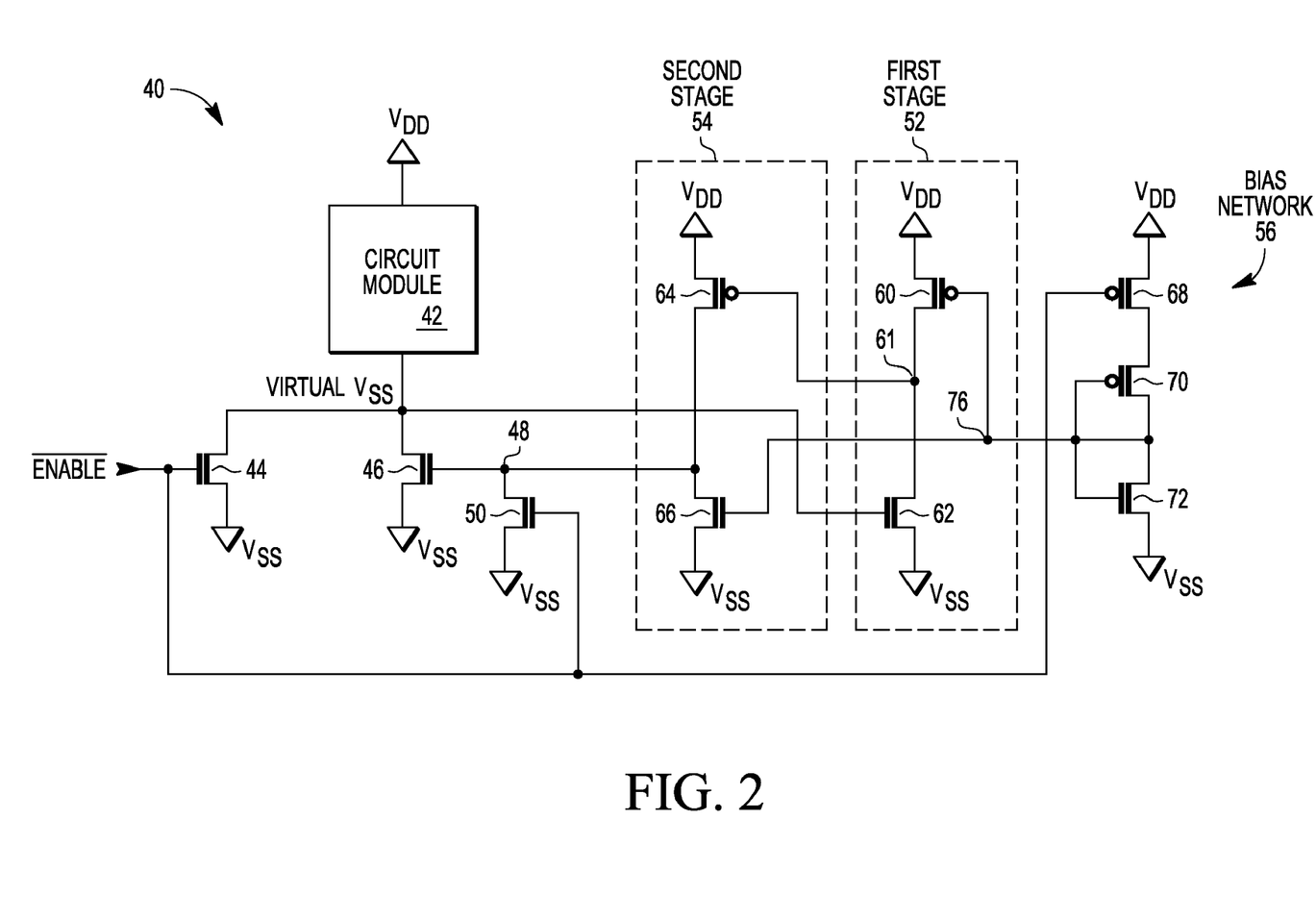
FIG. 2 illustrates in schematic form a circuit for voltage control in a semiconductor having a low power mode in accordance with another form of the present invention.

Illustrated in FIG. 2 is a circuit 40 for use in circuitry having a low power or idle mode of operation. Circuit 40 efficiently increases the voltage at a Virtual $V_{SS}$ terminal in response to entering an idle mode of operation wherein a positive power supply voltage $V_{DD}$ does not change in value. A circuit module 42 has a first voltage terminal connected to a terminal for receiving the $V_{DD}$ supply voltage and a second voltage terminal connected to a Virtual $V_{SS}$ terminal. A first stage 52 has a P-channel transistor 60 having a source connected to a terminal for receiving the $V_{DD}$ power supply, a gate connected to a node 76 and a drain connected to a node 61. An N-channel transistor 62 has a drain connected to the drain of transistor 60 at node 61, a gate connected to the Virtual $V_{SS}$ terminal, and a source connected to a terminal for receiving the $V_{SS}$ voltage. A second stage 54 has a P-channel transistor 64 having a source connected to a terminal for receiving the $V_{DD}$ power supply, a gate connected to node 61, and a drain connected to a drain of an N-channel transistor 66 at a node 48. A gate of transistor 66 is connected to a node 76 for receiving a bias voltage. A bias network 56 has a P-channel transistor 68 having a source connected to a terminal for receiving the $V_{DD}$ power supply, a gate for receiving an Enable signal in complementary form, and a drain. An N-channel transistor 70 has a drain connected to the drain of transistor 68. A gate of transistor 70 is connected to a source thereof at node 76 and to a drain of an N-channel transistor 72. A gate of transistor 72 is connected to the drain of transistor 72 at node 76. A source of transistor 72 is connected to a terminal for receiving the $V_{SS}$ power supply. An N-channel transistor 44 has a source connected to a terminal for receiving the $V_{SS}$ power supply, a gate for receiving the Enable signal in complementary form, and a drain connected to the Virtual $V_{SS}$ terminal. An N-channel transistor 46 has a drain connected to the Virtual $V_{SS}$ terminal, a gate connected to node 48, and a source connected to a terminal for receiving the $V_{SS}$ power supply. An N-channel transistor 50 has a drain connected to node 48, a gate for receiving the Enable signal in complementary form, and a source connected to the $V_{SS}$ terminal.

In operation, circuit 40 functions to provide either an original valued voltage $V_{SS}$ or an increased $V_{SS}$ supply voltage to power the circuit module 42. The complement form of the Enable signal (i.e. active low) directly determines which voltage, $V_{SS}$ or increased $V_{SS}$ is coupled to the circuit module 42. When the enable bar signal (i.e. the inverse of the enable signal) is a low logic value to place circuit module 42 of circuit 40 in an idle state of operation, transistors 44 and 50 are nonconductive and transistor 68 is conductive. The idle state of operation is a "drowsy" mode or an idle mode of operation in which circuit module 42 is sufficiently powered to maintain state information using an increased $V_{SS}$ voltage with a $V_{DD}$ supply voltage that is the same as in an active mode of operation. In the idle mode of operation, there is no normal circuit activity within the circuit module 42. Thus the term "idle" mode is herein used. The bias network 56 is enabled and node 76 is set at a bias voltage. Transistors 72, 70 and 66 form a current mirror circuit. The current that is flowing through transistors 70 and 72 is mirrored into transistors 60 and 66. The bias voltage of bias network 56 may assume various values and is determined by the physical and electrical characteristics of transistors 70 and 72. The first stage 52 has a gain element established by transistor 62. A gate-to-source voltage, $V_{GS}$, is established across transistor 62 on the Virtual $V_{SS}$ node. Transistor 60 functions as a load (i.e. also a current source) for transistor 62. The second stage 54 has a gain element that is established by transistor 64. Transistor 66 functions as a load for transistor 64. Transistor 46 provides a control gate for the first stage 52 and second stage 54 for providing an increased $V_{SS}$ to the Virtual $V_{SS}$ node. In this way, transistor 46 may be considered a third stage to the first stage 52 and second stage 54 with the circuit module 42 functioning as a load.

The voltage at the virtual $V_{SS}$ node is determined by the $V_{GS}$ of transistor 62. The desired voltage at the virtual $V_{SS}$ node is accomplished by the design of the physical and electrical characteristics of transistors 62 and 60. These characteristics primarily include the transistor channel dimensions and the transistor threshold voltage characteristic. During operation, if the Virtual $V_{SS}$ node drifts downward from the design's operating value, transistor 62 becomes biased weaker and the voltage at node 61 increases. This increase of voltage at node 61 biases transistor 64 weaker which in turn reduces the voltage bias applied to the gate of transistor 46 at node 48. Transistor 46 therefore is biased weaker which has the effect of increasing the voltage at the Virtual $V_{SS}$ node to counter the downward drift of voltage. If the Virtual $V_{SS}$ node drifts upward from the design's operating value, transistor 62 becomes biased stronger and the voltage at node 61 decreases. This decrease of voltage at node 61 biases transistor 64 stronger which in turn increases the voltage bias applied to the gate of transistor 46 at node 48. Transistor 46 therefore is biased stronger which has the effect of decreasing the voltage at the Virtual $V_{SS}$ node to counter the upward drift of voltage. These voltage relationships function as negative feedback to counter voltage changes (either up or down) at the Virtual $V_{SS}$ node. The negative feedback results from an odd number of stages wherein each stage implements a signal inversion between its input and output. The negative feedback response is determined by the loop gain of the product of the gains of the first stage 52, the second stage 54 and the transistor 46.

When the Enable BAR signal has a high logic value and circuit 40 is not in the Idle mode of operation, transistors 44 and 50 are conductive and transistor 68 is nonconductive. The high logic value of Enable BAR signal places the circuit module 42 in a normal mode of operation. In the normal mode of operation the normal or predetermined voltage value for $V_{SS}$ is connected to the Virtual $V_{SS}$ node by transistor 44. In this mode, the conduction of transistor 50 places the gate of transistor 46 at $V_{SS}$ to make transistor 46 nonconductive. Therefore, transistor 44 is the only transistor device connecting a voltage to the virtual $V_{SS}$ node. When transistor 68 is nonconductive, the bias voltage at node 76 is established at $V_{SS}$. The transistors 62 and 66 are nonconductive. Transistor 60 is made conductive under these operating conditions. As a result, node 61 is placed at the $V_{DD}$ potential and transistor 64 is therefore nonconductive. Since transistor 50 is conductive, the node 48 is placed at $V_{SS}$ which makes transistor 46 nonconductive. The circuit 40 remains operative until the Enable BAR control signal transitions back to a logic low value which indicates entrance into the Idle mode of operation.

Figure 3:
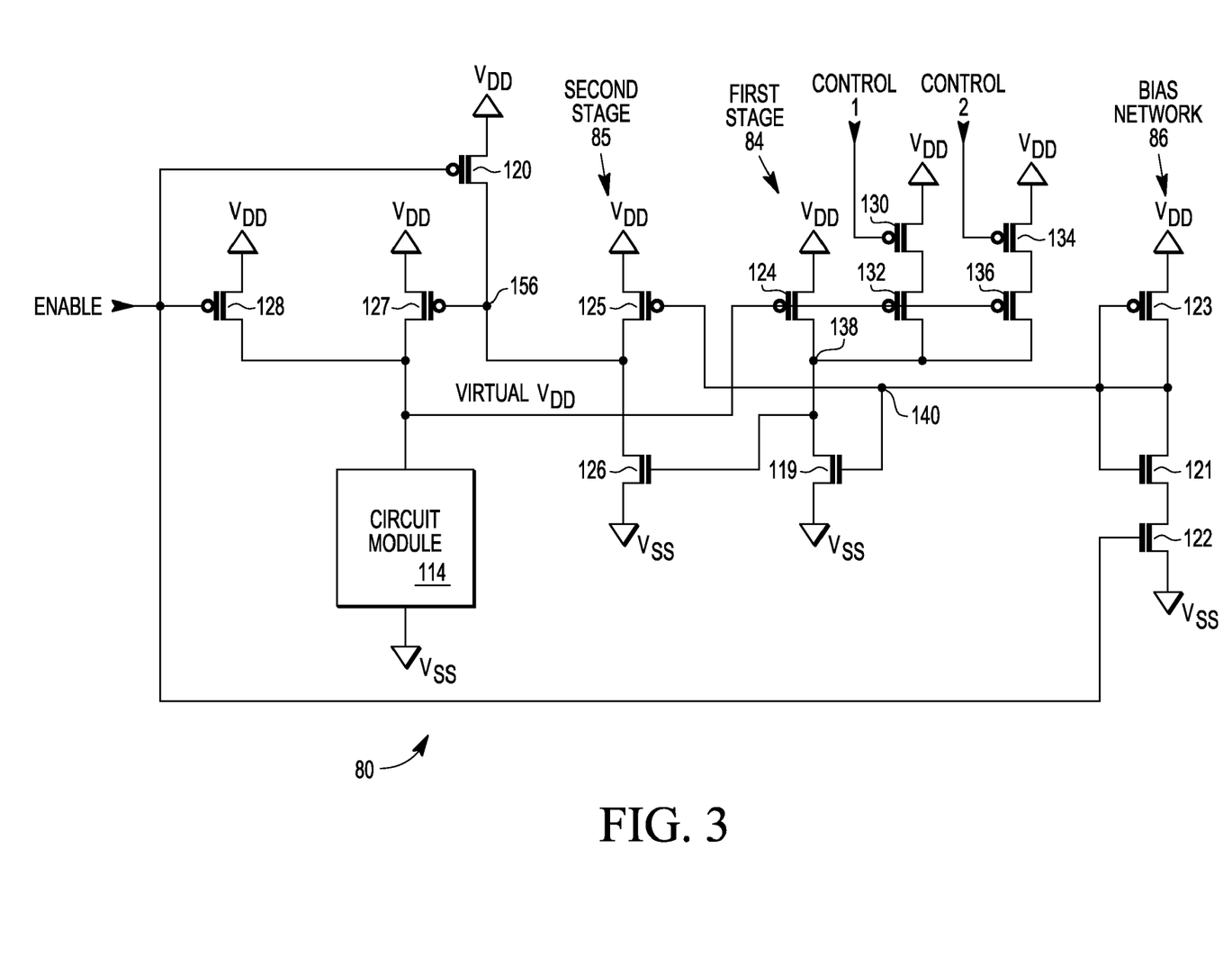
FIG. 3 illustrates in schematic form a circuit for voltage control in a semiconductor having a low power mode in accordance with another form of the present invention.

Illustrated in FIG. 3 is a circuit 80 for providing an operating voltage in accordance with yet another form of the present invention. Circuit 80 is programmable, such as by a user of a system incorporating circuit 80, for determining a value of operating voltage that is used during an idle mode of operation of a circuit module 114. The circuit module 114 has a first voltage terminal connected to a terminal for receiving a $V_{SS}$ voltage which, in one form, is an earth ground. A second voltage terminal of circuit module 114 is connected to a Virtual $V_{DD}$ node. A P-channel transistor 128 has a source connected to a terminal for receiving a supply voltage terminal for receiving supply voltage $V_{DD}$. The supply voltage $V_{DD}$ is more positive than the $V_{SS}$ supply voltage. A gate of transistor 128 is coupled to an Enable signal, and a drain of transistor is connected to the Virtual $V_{DD}$ node. A P-channel transistor 127 has a source connected to a supply voltage terminal for receiving supply voltage $V_{DD}$. A gate of transistor 127 is connected to a node 156 and a drain of transistor 127 is connected to the Virtual $V_{DD}$ node. A P-channel transistor 120 has a source connected to a terminal for receiving a supply voltage terminal for receiving supply voltage $V_{DD}$. A gate of transistor 120 is coupled to the Enable signal, and a drain of transistor 120 is connected to the gate of transistor 127 at node 156. An amplifier has a first stage 84 and a second stage 85 that are biased by a bias network 86. The bias network 86 has a P-channel transistor 123 having a source connected to a terminal for receiving the supply voltage $V_{DD}$. A gate of transistor 123 is connected to a drain thereof and to a node 140 for providing an output of the bias network 86. The drain of transistor 123 is connected to both a gate and a drain of an N-channel transistor 121. Both transistor 123 and 121 are therefore connected to form a diode. A source of transistor 121 is connected to a drain of an N-channel transistor 122. Transistor 122 has a gate for receiving the Enable signal and has a source connected to a terminal for receiving the supply voltage $V_{SS}$. Within the first stage 84, a P-channel transistor 124 has a source connected to a terminal for receiving the supply voltage $V_{DD}$. A gate of transistor 124 is connected to the Virtual $V_{DD}$ node. A drain of transistor 124 is connected to a drain of an N-channel transistor 119 at a node 138. A gate of transistor 119 is connected to node 140, and a source of transistor 119 is connected to a terminal for receiving the supply voltage $V_{SS}$. A P-channel transistor 130 has a source connected to a terminal for receiving the supply voltage $V_{DD}$. A gate of transistor 130 is coupled to a first control signal labeled 'Control 1'. A drain of transistor 130 is connected to a source of a P-channel transistor 132. A gate of transistor 132 is connected to the Virtual $V_{DD}$ node. A drain of transistor 132 is connected to node 138. A P-channel transistor 134 has a source connected to a terminal for receiving the supply voltage $V_{DD}$. A gate of transistor 134 is coupled to a second control signal labeled 'Control 2'. A drain of transistor 134 is connected to a source of a P-channel transistor 136. A gate of transistor 136 is connected to the Virtual $V_{DD}$ node. A drain of transistor 136 is connected to node 138. A second stage 85 has a P-channel transistor 125 having a source connected to a terminal for receiving the supply voltage $V_{DD}$. A gate of transistor 125 is coupled to the output of the bias network 86 at the node 140. A drain of transistor 125 is connected to the gate of transistor 127 at node 156 and to a drain of an N-channel transistor 126. A gate of transistor 126 is connected to an output of the first stage 84 by being connected to the drain of transistor 124 at node 138. A source of transistor 126 is connected to a terminal for receiving the supply voltage $V_{SS}$.

In operation, circuit 80 functions to provide either a full supply voltage $V_{DD}$ or a reduced supply voltage to power the circuit module 114. The Enable signal directly determines which voltage, $V_{DD}$ or reduced $V_{DD}$, is coupled to the circuit module 114. When the Enable signal is a high logic value circuit module 114 is placed in an idle state of operation. Transistors 128 and 120 are nonconductive and transistor 122 is conductive. The idle state of operation is a "drowsy" mode or an idle mode of operation in which circuit module 114 is sufficiently powered to maintain state information at a reduced $V_{DD}$ supply voltage. In this mode of operation, there is no normal circuit activity within circuit module 114. The bias network 86 is enabled and node 140 is set at a bias voltage. Transistors 121, 123 and 125 form a current mirror circuit. The current that is flowing through transistors 121 and 123 is mirrored into transistors 119 and 125. The bias voltage of bias network 86 may assume various values and is determined by the physical and electrical characteristics of transistors 121 and 123. Unlike the implementation of FIG. 1, the first stage 84 has a programmable gain element established by transistor 124 and the selection via a plurality of control signals. Series-connected transistors 130 and 132 and series-connected transistors 134 and 136 form a programming circuit for setting the gate-to-source voltage of transistor 124.

Series-connected transistors 130 and 132 and series-connected transistors 134 and 136 each form a transistor pair of P-channel devices. The transistor pairs are selectively enabled to conduct current by the user programmable control signals. It should be understood that any number of pairs of series-connected transistors may be connected to node 138 to provide current to node 138. When one or both of the illustrated pairs of series-connected transistors are enabled to conduct current in response to the control signals, the conducting transistors change the gate-to-source voltage, $V_{GS}$, of transistor 124. The additional coupling of transistors between the $V_{DD}$ power supply terminal and node 138 has the affect of changing the physical characteristics of transistor 124 by adding more effective channel width to the transistor 124. This additional channel width changes the $V_{GS}$. A change in the gate-to-source voltage of transistor 124 changes the voltage at the virtual $V_{DD}$ node because the $V_{GS}$ is related to the voltage at the virtual $V_{DD}$ node.

A gate-to-source voltage, $V_{GS}$, established across transistor 124 and any enabled pair of transistors coupled in parallel between $V_{DD}$ and node 138 is on the Virtual $V_{DD}$ node. Transistor 119 functions as a load (i.e. also a current source) for transistor 124 and any enabled pair of transistor connected to node 138. The second stage 85 has a gain element that is established by transistor 126. Transistor 125 functions as a load for transistor 126. Transistor 127 provides a control gate for the first stage 84 and second stage 85 for providing a reduced $V_{DD}$ to the Virtual $V_{DD}$ node. In this way, transistor 127 may be considered a third stage to the first stage 84 and second stage 85 with the circuit module 114 functioning as a load.

The voltage at the virtual $V_{DD}$ node is determined by the $V_{GS}$ of transistor 124 and any enabled pair of transistors coupled in parallel between $V_{DD}$ and node 138. The desired voltage at the virtual $V_{DD}$ node is accomplished by the design of the physical and electrical characteristics of transistors 124 and 119 and any enabled pair of transistors. These characteristics primarily include the transistor channel dimensions and the transistor threshold voltage characteristic. During operation, if the Virtual $V_{DD}$ node drifts downward from the design's operating value, transistor 124 and any enabled pair of transistors become biased stronger and the voltage at node 138 increases. This increase of voltage at node 138 biases transistor 126 stronger which in turn reduces the voltage bias applied to the gate of transistor 127 at node 156. Transistor 127 therefore is biased stronger which has the effect of increasing the voltage at the Virtual $V_{DD}$ node to counter the downward drift of voltage. If the Virtual $V_{DD}$ node drifts upward from the design's operating value, transistor 124 and any enabled pair of transistors becomes biased weaker and the voltage at node 138 decreases. This decrease of voltage at node 138 biases transistor 126 weaker which in turn increases the voltage bias applied to the gate of transistor 127 at node 156. Transistor 127 therefore is biased less which has the effect of decreasing the voltage at the Virtual $V_{DD}$ node to counter the upward drift of voltage. These voltage relationships function as negative feedback to counter voltage changes (either up or down) at the Virtual $V_{DD}$ node. The negative feedback results from an odd number of stages wherein each stage implements a signal inversion between its input and output. The negative feedback response is determined by the loop gain of the product of the gains of the first stage 84, the second stage 85 and the transistor 127.

When the Enable signal has a low logic value, transistors 128 and 120 are conductive and transistor 122 is nonconductive. The Enable signal places the circuit module 114 in a normal mode of operation. In the normal mode of operation the full supply voltage value, $V_{DD}$, is connected to the Virtual $V_{DD}$ node by transistor 128. In this mode, the conduction of transistor 120 places the gate of transistor 127 at $V_{DD}$ to make transistor 127 nonconductive. Therefore, transistor 128 is the only transistor device connecting a voltage to the virtual $V_{DD}$ node. When transistor 122 is nonconductive, the bias voltage at node 140 is established at $V_{DD}$. The transistors 124 and 125 are nonconductive. Transistor 119 is made conductive under these operating conditions. As a result, node 138 is placed at the $V_{SS}$ potential and transistor 126 is therefore nonconductive. Since transistor 120 is conductive, the node 156 is placed at $V_{DD}$ which makes transistor 127 nonconductive. A portion of the circuit 80 remains inoperative until the Enable control signal transitions back to a logic high which indicates entrance into the Idle mode.

In another form of circuit 80, instead of using transistors 130, 132, 134, 136 to program variation of the Virtual $V_{DD}$ node voltage, the current through transistor 119 can be varied to program the virtual $V_{DD}$ node voltage. In other words, transistor 119 may be implemented as a variable current source which also functions as a load. An advantage of either form of FIG. 3 is that circuit 80 may be utilized as a standard cell element in a standard cell library whenever a drowsy voltage controller is desired.

In another form of circuit 80, instead of using transistors 130, 132, 134 and 136 to program variation of the Virtual $V_{DD}$ node voltage, the bulk terminal of a MOSFET implementing transistor 124 could be varied to produce the desired change in the Virtual $V_{DD}$ voltage.

By now it should be appreciated that there has been provided various embodiments of a voltage circuit that accurately provides a reduced voltage and is size and power efficient. The voltage circuit described herein avoids the need of an operational amplifier or a reference voltage generator to establish an accurate voltage for a reduced power mode of operation. The virtual $V_{DD}$ and virtual $V_{SS}$ voltage values of the various circuit embodiments described herein track with variations in the threshold voltage variations of transistors within a same circuit. For example, while the threshold voltages of transistors 27 and 24 of FIG. 1 each vary, they will vary proportionately and the effects are minimized so that the Virtual $V_{DD}$ voltage remains substantially unaffected by transistor threshold voltage variation. The embodiments described herein have circuit component characteristic variations have been largely compensated for and the reduced voltage value can be accurately established within a very small margin for variation. By using a self-biasing constant current load inverter with signal feedback, the virtual $V_{DD}$ or virtual $V_{SS}$ voltage is accurately regulated. For example, in FIG. 1 the signal feedback path is from the Virtual $V_{DD}$ node to the gate of transistor 24 which affects the voltage of node 35 which affects the bias of transistor 26 which affects the voltage of node 36 which affects the bias of transistor 27 which affects the Virtual $V_{DD}$ node. Since this biasing network tracks with threshold voltage changes, the stability of the value of the voltage of the Virtual $V_{DD}$ node is excellent. In all embodiments, the small amount of required circuitry (as opposed to a voltage regulator having an operational amplifier or voltage reference) is small in terms of circuit area and power consumption.

There is herein provided in one form a circuit for providing an operating voltage. A first transistor has a first current electrode coupled to a first supply voltage terminal, a second current electrode coupled to a virtual supply voltage node, and a control electrode. A second transistor has a first current electrode coupled to the first supply voltage terminal, a second current electrode, and a control electrode coupled to the virtual supply voltage node. A first load has an input coupled to a second supply voltage terminal, an output coupled to the second current electrode of the second transistor, and a control input. A third transistor has a first current electrode, a control electrode coupled to the output of the first load, and a second current electrode coupled to the second supply voltage terminal. A second load has an input coupled to the first supply voltage terminal, an output coupled to the control electrode of the first transistor and the first current electrode of the third transistor, and a control input. A bias network is coupled to provide a first bias voltage to the control input of the first load and a second bias voltage to the control input of the second load. A circuit module has a first power terminal coupled to the virtual supply voltage node and a second power terminal coupled to the second supply voltage terminal, wherein the virtual supply voltage node provides the operating voltage to the circuit module. In one form there is herein provided a fourth transistor having a first current electrode coupled to the first supply voltage terminal, a control electrode coupled to a low power enable signal, and a second current electrode coupled to the virtual supply voltage node. In another form when the low power enable signal is negated, the fourth transistor couples the first supply voltage terminal to the virtual supply voltage node to provide the operating voltage to the circuit module. In another form when the low power enable signal is asserted, the bias network is enabled and the first transistor couples the first supply voltage terminal to the virtual supply voltage node to provide the operating voltage to the circuit module. In yet another form the first load is a first current source, wherein the input of the first load is coupled to an input of the first current source and the output of the first load is coupled to an output of the first current source. The second load is a second current source, wherein the input of the second load is coupled to an input of the second current source and the output of the second load is coupled to an output of the second current source. In yet another form at least one of the first current source and the second current source is a variable current source. In yet another form the first load is a fourth transistor having a first current electrode coupled the input of the first load, a second current electrode coupled to the output of the first load, and a control electrode coupled to receive the first bias voltage. The second load is a fifth transistor having a first current electrode coupled to the input of the second load, a second current electrode coupled to the output of the second load, and a control electrode coupled to receive the second bias voltage. In yet another form the first bias voltage has a same voltage value as the second bias voltage. In another form the bias network has a fourth transistor having a first current electrode coupled to the first supply voltage terminal, a second current electrode, and a control electrode coupled to the control input of the second load. A fifth transistor has a first current electrode coupled to the second current electrode of the fourth transistor, a second current electrode, and a control electrode coupled to the control input of the first load. In another form there is provided a sixth transistor having a first current electrode coupled to the second current electrode of the fifth transistor, a second current electrode coupled to the second supply voltage terminal, and a control electrode coupled to a low power enable signal. When the low power enable signal is asserted, the sixth transistor couples the second current electrode of the fifth transistor to the second supply voltage terminal, the control electrode of the fourth transistor provides the second bias voltage to the control input of the second load, and the control electrode of the fifth transistor provides the first bias voltage to the control input of the first load. In yet another form the first transistor and the second transistor are P-type transistors, a first supply voltage that is coupled to the first supply voltage terminal is more positive than a second supply voltage coupled to the second supply voltage terminal, and the third transistor is an N-type transistor. In yet another form the first transistor and the second transistor are N-type transistors, the second supply voltage coupled to the second supply voltage terminal is more positive than a first supply voltage coupled to the first supply voltage terminal, and the third transistor is a P-type transistor. In another form there is provided a programming circuit which sets a gate-to-source voltage of the second transistor.

In another form there is provided a circuit for providing an operating voltage and having first, second and third transistors, first and second loads and a circuit module. The first transistor has a first current electrode coupled to a first supply voltage terminal, a second current electrode coupled to a virtual supply voltage node, and a control electrode. The second transistor has a first current electrode coupled to the first supply voltage terminal, a second current electrode, and a control electrode coupled to the virtual supply voltage node. A first load has an input and has an output coupled to the second current electrode of the second transistor. The third transistor has a first current electrode, a control electrode coupled to the output of the first load, and a second current electrode. The second load has an input coupled to the first supply voltage terminal, and an output coupled to the control electrode of the first transistor and the first current electrode of the third transistor. The circuit module has a first power terminal coupled to the virtual supply voltage node and a second power terminal coupled to a second supply voltage terminal wherein the virtual supply voltage node provides the operating voltage to the circuit module. In another form the first load is a first current source, wherein the input of the first load is coupled to an input of the first current source and the output of the first load is coupled to an output of the first current source. The second load is a second current source, wherein the input of the second load is coupled to an input of the second current source and the output of the second load is coupled to an output of the second current source. An input of the first load is coupled to the second supply voltage terminal, and the second current electrode of the third transistor is coupled to the second supply voltage terminal.

In one form, the first load is a fourth transistor having a first current electrode coupled the input of the first load, a second current electrode coupled to the output of the first load, and a control electrode coupled to receive a first bias voltage. In this form the second load is a fifth transistor having a first current electrode coupled to the input of the second load, a second current electrode coupled to the output of the second load, and a control electrode coupled to receive a second bias voltage. In another form the first bias voltage has a same voltage value as the second bias voltage.

In yet another form there is provided a circuit for providing an operating voltage having a first transistor having a first current electrode coupled to a first supply voltage terminal. A second current electrode is coupled to a virtual supply voltage node. The first transistor also has a control electrode. A second transistor has a first current electrode coupled to the first supply voltage terminal, a second current electrode, and a control electrode coupled to the virtual supply voltage node. A first load has an input coupled to a second supply voltage terminal, an output coupled to the second current electrode of the second transistor, and a control input. A third transistor has a first current electrode, a control electrode coupled to the output of the first load, and a second current electrode coupled to the second supply voltage terminal. A second load has an input coupled to the first supply voltage terminal, an output coupled to the control electrode of the first transistor and the first current electrode of the third transistor, and a control input. A bias network is coupled to provide a first bias voltage to the control input of the first load and a second bias voltage to the control input of the second load. A circuit module has a first power terminal coupled to the virtual supply voltage node and a second power terminal coupled to the second supply voltage terminal. The virtual supply voltage node provides the operating voltage to the circuit module. A programming circuit varies a gate-to-source voltage of the second transistor. In another form the programming circuit varies a current through the first load. In yet another form the programming circuit varies an effective width of a channel of the second transistor.

Although the invention has been described with respect to specific conductivity types or polarity of potentials, skilled artisans appreciate that conductivity types and polarities of potentials may be reversed. In an alternative any of the embodiments described herein may be implemented by reversing the conductivities of each of the transistors from what is shown. In such embodiments it should be understand that functionality of specific transistors also reverses. For example, the gain devices and the load devices will reverse in such alternate embodiments.

In other alternative forms of FIG. 1, additional circuitry (not shown) may be used to make both of transistors 28 and 27 conductive in response to the Enable signal being in an inactive low state. For example an inversion of the enable signal may be connected to the gate of an N-channel transistor that is connected between the gate of transistor 27 and $V_{SS}$. The additional N-channel transistor would connect $V_{SS}$ to the gate of transistor 27 when the enable signal is in an inactive low state which would bias transistor 27 on. In such an alternative form both transistors 28 and 27 would source current from the $V_{DD}$ supply to the Virtual $V_{DD}$ node and to circuit module 14.

In alternative forms of FIG. 2, additional circuitry (not shown) may be used to make both of transistors 44 and 46 conductive in response to the Enable bar signal being in an inactive high state. For example an inversion of the enable bar signal may be connected to the gate of a P-channel transistor that is connected between the gate of transistor 46 and $V_{DD}$. The additional P-channel transistor would connect $V_{DD}$ to the gate of transistor 46 when the enable signal is in an inactive high state which would bias transistor 46 on. In such an alternative form both transistors 44 and 46 would sink current to the $V_{SS}$ supply from the Virtual $V_{SS}$ node and from circuit module 14.

In other alternative forms of FIG. 3, additional circuitry (not shown) may be used to make both of transistors 128 and 127 conductive in response to the Enable signal being in an inactive low state. For example an inversion of the enable signal may be connected to the gate of an N-channel transistor that is connected between the gate of transistor 127 and $V_{SS}$. The additional N-channel transistor would connect $V_{SS}$ to the gate of transistor 127 when the enable signal is in an inactive low state which would bias transistor 127 on. In such an alternative form both transistors 128 and 127 would source current from the $V_{DD}$ supply to the Virtual $V_{DD}$ node and to circuit module 114.

It should further be understood that the loads described in all embodiments may be implemented as either an active load or a passive load. For example, the transistors 20 and 25 of FIG. 1 may be implemented either as active loads (transistors, thyristors, etc.) or as passive loads (resistive devices such as resistors, capacitive devices such as capacitors, etc.).

The term "coupled," as used herein, is not intended to be limited to a direct coupling or a mechanical coupling.

Although the invention is described herein with reference to specific embodiments, various modifications and changes can be made without departing from the scope of the present invention as set forth in the claims below. For example, various types of transistors may be implemented, such as MOS (metal oxide semiconductor), bipolar, GaAs, silicon on insulator (SOI) and others. The amount of power supply voltage reduction can be adjusted according to specific application requirements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit for providing an operating voltage comprising:
   a first transistor having a first current electrode coupled to a first supply voltage terminal, a second current electrode coupled to a virtual supply voltage node, and a control electrode;
   a second transistor having a first current electrode coupled to the first supply voltage terminal, a second current electrode, and a control electrode coupled to the virtual supply voltage node;
   a first load having an input coupled to a second supply voltage terminal, an output coupled to the second current electrode of the second transistor, and a control input;
   a third transistor having a first current electrode, a control electrode coupled to the output of the first load, and a second current electrode coupled to the second supply voltage terminal;
   a second load having an input coupled to the first supply voltage terminal, an output coupled to the control electrode of the first transistor and the first current electrode of the third transistor, and a control input;
   a bias network coupled to provide a first bias voltage to the control input of the first load and a second bias voltage to the control input of the second load; and
   a circuit module having a first power terminal coupled to the virtual supply voltage node and a second power terminal coupled to the second supply voltage terminal, wherein the virtual supply voltage node provides the operating voltage to the circuit module.

2. The circuit of claim 1, further comprising:
   a fourth transistor having a first current electrode coupled to the first supply voltage terminal, a control electrode coupled to a low power enable signal, and a second current electrode coupled to the virtual supply voltage node.

3. The circuit of claim 2, wherein when the low power enable signal is negated, the fourth transistor couples the first supply voltage terminal to the virtual supply voltage node to provide the operating voltage to the circuit module.

4. The circuit of claim 3, wherein when the low power enable signal is asserted, the bias network is enabled and the first transistor couples the first supply voltage terminal to the virtual supply voltage node to provide the operating voltage to the circuit module.

5. The circuit of claim 1, wherein:
the first load comprises a first current source, wherein the input of the first load is coupled to an input of the first current source and the output of the first load is coupled to an output of the first current source; and
the second load comprises a second current source, wherein the input of the second load is coupled to an input of the second current source and the output of the second load is coupled to an output of the second current source.

6. The circuit of claim 5, wherein at least one of the first current source and the second current source is a variable current source.

7. The circuit of claim 1, wherein:
the first load comprises a fourth transistor having a first current electrode coupled the input of the first load, a second current electrode coupled to the output of the first load, and a control electrode coupled to receive the first bias voltage; and
the second load comprises a fifth transistor having a first current electrode coupled to the input of the second load, a second current electrode coupled to the output of the second load, and a control electrode coupled to receive the second bias voltage.

8. The circuit of claim 1, wherein the first bias voltage has a same voltage value as the second bias voltage.

9. The circuit of claim 1, wherein the bias network comprises:
a fourth transistor having a first current electrode coupled to the first supply voltage terminal, a second current electrode, and a control electrode coupled to the control input of the second load; and
a fifth transistor having a first current electrode coupled to the second current electrode of the fourth transistor, a second current electrode, and a control electrode coupled to the control input of the first load.

10. The circuit of claim 9, further comprising:
a sixth transistor having a first current electrode coupled to the second current electrode of the fifth transistor, a second current electrode coupled to the second supply voltage terminal, and a control electrode coupled to a low power enable signal, wherein when the low power enable signal is asserted, the sixth transistor couples the second current electrode of the fifth transistor to the second supply voltage terminal, the control electrode of the fourth transistor provides the second bias voltage to the control input of the second load, and the control electrode of the fifth transistor provides the first bias voltage to the control input of the first load.

11. The circuit of claim 1, wherein:
the first transistor and the second transistor are P-type transistors, a first supply voltage coupled to the first supply voltage terminal is more positive than a second supply voltage coupled to the second supply voltage terminal, and the third transistor is an N-type transistor.

12. The circuit of claim 1, wherein:
the first transistor and the second transistor are N-type transistors, a second supply voltage coupled to the second supply voltage terminal is more positive than a first power supply voltage coupled to the first supply voltage terminal, and the third transistor is a P-type transistor.

13. The circuit of claim 1, further comprising a programming circuit which sets a gate-to-source voltage of the second transistor.

14. A circuit for providing an operating voltage comprising:
a first transistor having a first current electrode coupled to a first supply voltage terminal, a second current electrode coupled to a virtual supply voltage node, and a control electrode;
a second transistor having a first current electrode coupled to the first supply voltage terminal, a second current electrode, and a control electrode coupled to the virtual supply voltage node;
a first load having an input and having an output coupled to the second current electrode of the second transistor, wherein the first load comprises a fourth transistor having a first current electrode coupled the input of the first load, a second current electrode coupled to the output of the first load, and a control electrode coupled to receive a first bias voltage; and
a third transistor having a first current electrode, a control electrode coupled to the output of the first load, and a second current electrode;
a second load having an input coupled to the first supply voltage terminal, and an output coupled to the control electrode of the first transistor and the first current electrode of the third transistor, wherein the second load comprises a fifth transistor having a first current electrode coupled to the input of the second load, a second current electrode coupled to the output of the second load, and a control electrode coupled to receive a second bias voltage; and
a circuit module having a first power terminal coupled to the virtual supply voltage node and a second power terminal coupled to a second supply voltage terminal wherein the virtual supply voltage node provides the operating voltage to the circuit module.

15. The circuit of claim 14, wherein the first load comprises a first current source, wherein the input of the first load is coupled to an input of the first current source and the output of the first load is coupled to an output of the first current source:
wherein the second load comprises a second current source, wherein the input of the second load is coupled to an input of the second current source and the output of the second load is coupled to an output of the second current source; and
wherein an input of the first load is coupled to the second supply voltage terminal and the second current electrode of the third transistor is coupled to the second supply voltage terminal.

16. The circuit of claim 14, wherein the first bias voltage has a same voltage value as the second bias voltage.

17. A circuit for providing an operating voltage comprising:
a first transistor having a first current electrode coupled to a first supply voltage terminal, a second current electrode coupled to a virtual supply voltage node, and a control electrode;
a second transistor having a first current electrode coupled to the first supply voltage terminal, a second current electrode, and a control electrode coupled to the virtual supply voltage node;
a first load having an input coupled to a second supply voltage terminal, an output coupled to the second current electrode of the second transistor, and a control input;

a third transistor having a first current electrode, a control electrode coupled to the output of the first load, and a second current electrode coupled to the second supply voltage terminal;

a second load having an input coupled to the first supply voltage terminal, an output coupled to the control electrode of the first transistor and the first current electrode of the third transistor, and a control input;

a bias network coupled to provide a first bias voltage to the control input of the first load and a second bias voltage to the control input of the second load;

a circuit module having a first power terminal coupled to the virtual supply voltage node and a second power terminal coupled to the second supply voltage terminal, wherein the virtual supply voltage node provides the operating voltage to the circuit module; and a programming circuit which varies a gate-to-source voltage of the second transistor.

18. The circuit of claim 17, wherein the programming circuit varies a current through the first load.

19. The circuit of claim 17, wherein the programming circuit varies an effective width of a channel of the second transistor.

* * * * *